United States Patent
Fukunaga

(10) Patent No.: US 6,456,638 B1
(45) Date of Patent: Sep. 24, 2002

(54) HIGH-POWER SHORT-WAVELENGTH SEMICONDUCTOR LIGHT EMITTING DEVICE HAVING ACTIVE LAYER WITH INCREASED INDIUM CONTENT

(75) Inventor: Toshiaki Fukunaga, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/500,419

(22) Filed: Feb. 8, 2000

(30) Foreign Application Priority Data

Feb. 8, 1999 (JP) ............................................. 11-030050

(51) Int. Cl.⁷ ................................................. H01S 5/00
(52) U.S. Cl. ............................ 372/45; 372/43; 372/44; 372/45
(58) Field of Search ................................ 372/43, 45, 44

(56) References Cited

U.S. PATENT DOCUMENTS 5,625,634 A * 4/1997 Ukita et al. .................... 372/45

OTHER PUBLICATIONS

Nakamura, Shuji; Senoh, Masayuki; Nagahama, Shin–ichi; Iwasa, Naruhito; Yamada, Takao; Matsushita, Toshio; Kiyoku, Hiroyuki; Sugimoto, Yasunobu; Kozaki, Tokuya; Umemoto, Hitoshi; Sano, Masahiko and Chocho, Kazuyuki; High Power, Long–Lifetime InGaN/GaN/AlGaN–Based Laser Diodes Grown on Pure GaN Substrates, Japan J. Appl. Phys., vol. 37 (1998), pp.. L309–L312.

* cited by examiner

Primary Examiner—Paul Ip
Assistant Examiner—Delma R. Flores Ruiz
(74) Attorney, Agent, or Firm—Stroock & Stroock & Lavan LLP

(57) ABSTRACT

A semiconductor laser device contains a pair of electrodes; a conductive substrate connected to one of the pair of electrodes; a lower cladding layer formed on the conductive substrate; a lower optical waveguide layer formed on the lower cladding layer; a quantum well active layer formed on the lower optical waveguide layer; an upper optical waveguide layer formed on the quantum well active layer; an upper cladding layer formed on the upper optical waveguide layer; and a contact layer formed on the upper cladding layer. The other of the pair of electrodes is formed on the contact layer, and the conductive substrate is made of InGa material. The lower cladding layer is made of one of InGaN and InGaAlN material and has a composition which causes a strain not less than −0.01 and not greater than 0.01 between the lower cladding layer and the conductive substrate.

19 Claims, 12 Drawing Sheets

F I G . 11
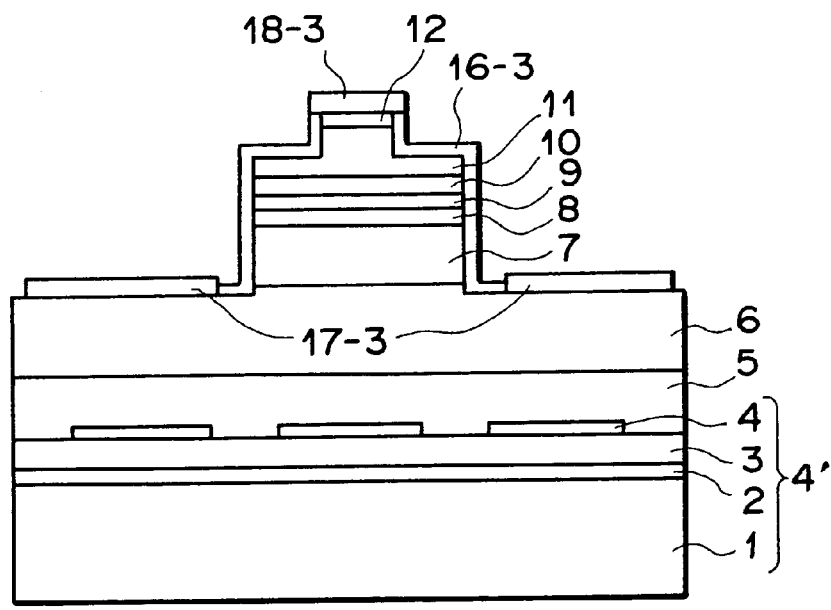
F I G . 12
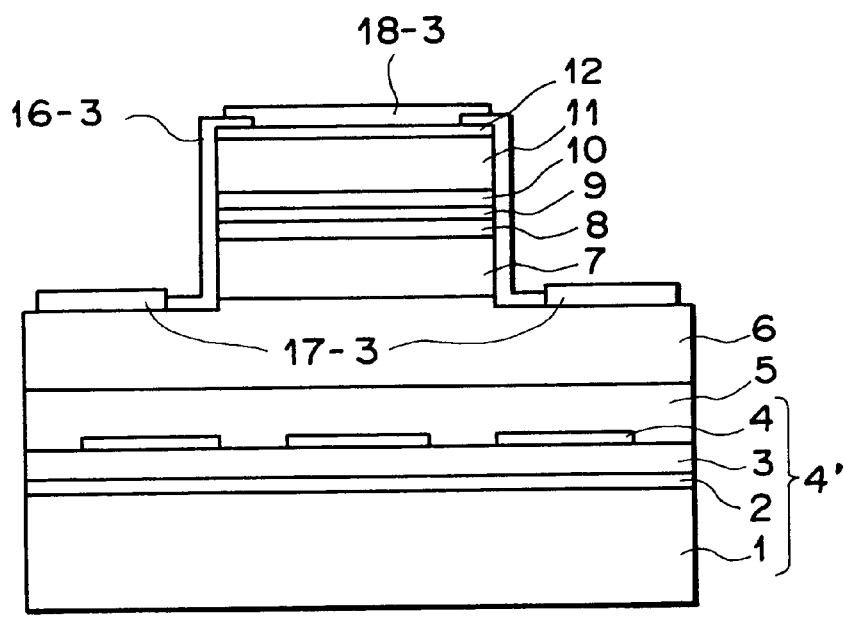

F I G. 20
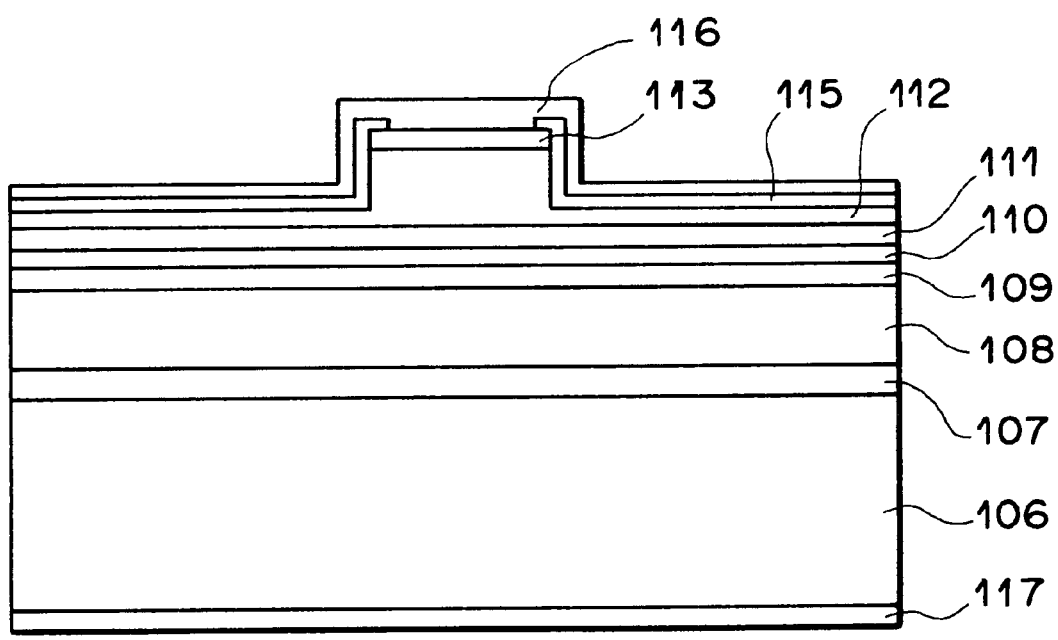

HIGH-POWER SHORT-WAVELENGTH SEMICONDUCTOR LIGHT EMITTING DEVICE HAVING ACTIVE LAYER WITH INCREASED INDIUM CONTENT

BACKGROUND OF THE INVENTION

1. Field of the Invention

The present invention relates to a semiconductor laser device having a layered structure which is lattice-matched with a substrate. The semiconductor laser devices referred to in this specification may include semiconductor laser diodes, semiconductor optical amplifying devices, and any other semiconductor laser devices.

2. Description of the Related Art

Currently, short-wavelength semiconductor laser devices using GaN materials and II-VI group materials are being studied. For example, Japanese Journal of Applied Physics, Vol. 37 (1998) pp.L309–L312 reports a semiconductor laser device which is constructed by forming, on a GaN substrate, an n-type GaN buffer layer, an n-type InGaN crack preventing layer, an n-AlGaN/GaN modulation-doped superlattice cladding layer, an n-type GaN optical waveguide layer, an n-InGaN/InGaN multiple quantum well active layer, a p-type AlGaN carrier block layer, a p-type GaN optical waveguide layer, an p-AlGaN/GaN modulation-doped superlattice cladding layer, and a p-type GaN contact layer, where the GaN substrate is formed by selective growth using a mask of an $SiO_2$ film on a GaN layer formed on a sapphire substrate. Oscillation of the 410 nm band is realized by the above semiconductor laser device.

However, there is a great degree of lattice mismatching (i.e., a great strain) between the GaN substrate and the active layer in the above construction of layers. Therefore, it is impossible to increase the indium content in the active layer, and thus conventional semiconductor laser devices which operate at wavelengths equal to or longer than 450 nm are not reliable.

The strain between the grown layer and the substrate is defined as $(a-a_s)/a_s$, where $a_s$ denotes a lattice constant of the substrate, and a denotes a lattice constant of the grown layer. Generally, the "lattice matching" is defined by the condition that the strain is not less than −0.01 and not greater than 0.01.

As described above, in order to obtain reliable semiconductor laser devices which oscillate at wavelengths equal to or longer than 450 nm, it is necessary to increase the indium content in the active layer. However, conventionally, it is difficult to realize such semiconductor laser devices due to the increase in the strain because the great strain between the grown layers and the substrate is liable to cause cracking or dislocation. Therefore, reliability of the conventional semiconductor laser devices is decreased in high power operations.

In addition, in semiconductor laser devices, it is desirable to thicken cladding layers to reduce overflow currents and optical losses. However, conventionally, it is also impossible to realize thick cladding layers due to the above great strain, which is liable to cause cracking.

SUMMARY OF THE INVENTION

The object of the present invention is to provide a short-wavelength semiconductor laser device which is reliable in high power operations.

The object of the present invention is accomplished by the present invention, which provides a semiconductor laser device which contains a conductive substrate connected to one of a pair of electrodes, a lower cladding layer, a lower optical waveguide layer, a single or multiple quantum well active layer, an upper optical waveguide layer, an upper cladding layer, a contact layer, and the other of the pair of electrodes, which are stacked in this order, wherein the conductive substrate is made of InGa material, and the lower cladding layer has a composition which causes a strain which is not less than −0.01 and not greater than 0.01 between the lower cladding layer and the conductive substrate, and is made of one of InGaN and InGaAlN material.

The above conductive substrate may be formed on a first substrate which is formed on a second substrate by selective growth, where the first substrate may be made of InGa material.

Since the InGaN substrate is used, instead of the conventional GaN substrate, the range of compositions realizing lattice matching is extended. Therefore, it becomes possible to use InGaAlN material for the cladding layer so that the cladding layer lattice-matches the InGaN substrate. Hence, generation of cracking or dislocation can be prevented, and the indium content in the active layer can be increased. Thus, high-power long-wavelength oscillation up to 550 nm can be realized.

In addition, since generation of cracking is prevented by the lattice-matching between the cladding layers and the substrate, it is possible to realize cladding layers having thickness equal to or more than one micrometer, which is sufficient to reduce the amounts of overflow currents and optical losses in the optical waveguide. Thus, reliability is increased.

In the above semiconductor laser device according to the present invention, the contact layer may be made of InGaN material. In this case, the contact resistance can be reduced, and therefore temperature increase in high power operations can be reduced. Therefore, reliability of the semiconductor laser device in high power operations is increased.

Since, according to the present invention, all or almost all of the layers above the InGaN substrate of the semiconductor laser device include indium, the number of changes in growth temperature during the formation of the layers can be reduced. Therefore, it is possible to reduce growth interruption time, which is necessary for raising or lowering the growth temperature, and it is also possible to reduce probability of defect generation during the growth interruptions.

In the above semiconductor laser device according to the present invention, the cladding layers may have a superlattice structure, and compositions of the cladding layers may be such that the strain in the cladding layer is not less than −0.01 and not greater than 0.01.

In addition, the above cladding layers may have a modulation-doped superlattice structure in which impurity is doped into barrier layers in the superlattice structure, and compositions of the cladding layers may be such that the strain in the cladding layer is not less than −0.01 and not greater than 0.01 . Further, the cladding layers may have a superlattice structure in which impurity is doped into both of the well layers and the barrier layers in the superlattice structure.

Further, preferably, the first substrate may be one of sapphire, SiC, ZnO, $LiGaO_2$, $LiAlO_2$, ZnSe, GaAs, GaP, Ge, and Si.

DESCRIPTION OF THE DRAWINGS

FIG. 11 is a cross-sectional view of the optical amplifying device as the fourth embodiment of the present invention taken along line XI—XI in FIG. 10.

FIG. 12 is a cross-sectional view of the optical amplifying device as the fourth embodiment of the present invention taken along line XII—XII in FIG. 10.

FIG. 20 is a cross-sectional view of a complete construction of the semiconductor laser device as the sixth embodiment of the present invention.

DESCRIPTION OF PREFERRED EMBODIMENTS

Embodiments of the present invention are explained in detail below with reference to drawings.

First Embodiment

Figure 1:
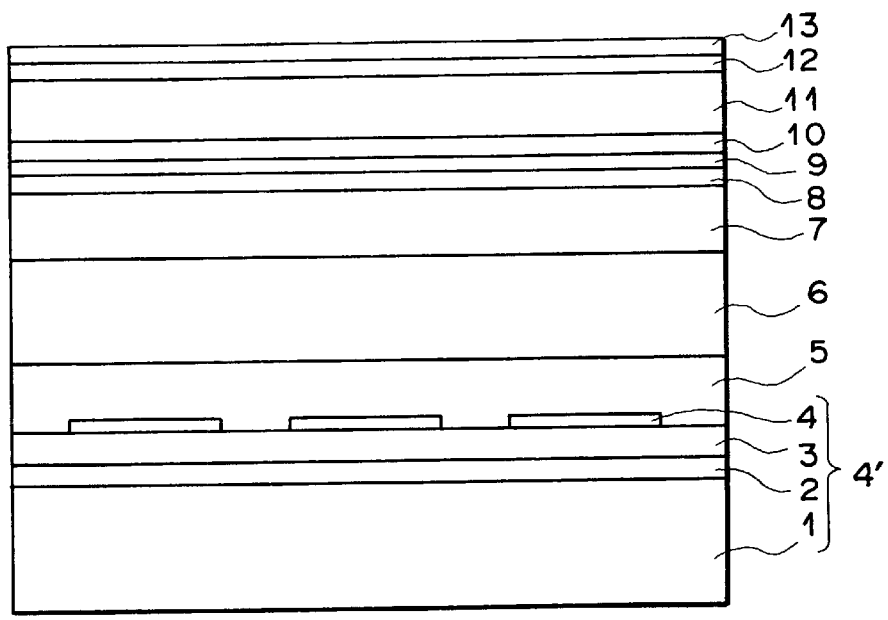
FIG. 1 is a cross-sectional view of the short-wavelength semiconductor laser device as the first embodiment of the present invention at a first intermediate production stage.
Figure 2:
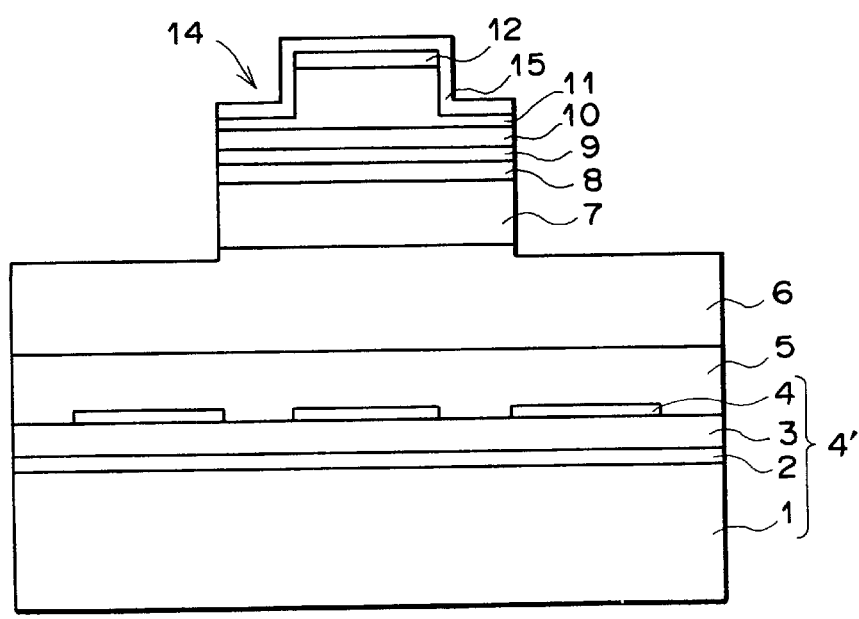
FIG. 2 is a cross-sectional view of the short-wavelength semiconductor laser device as the first embodiment of the present invention at a second intermediate production stage.
Figure 3:
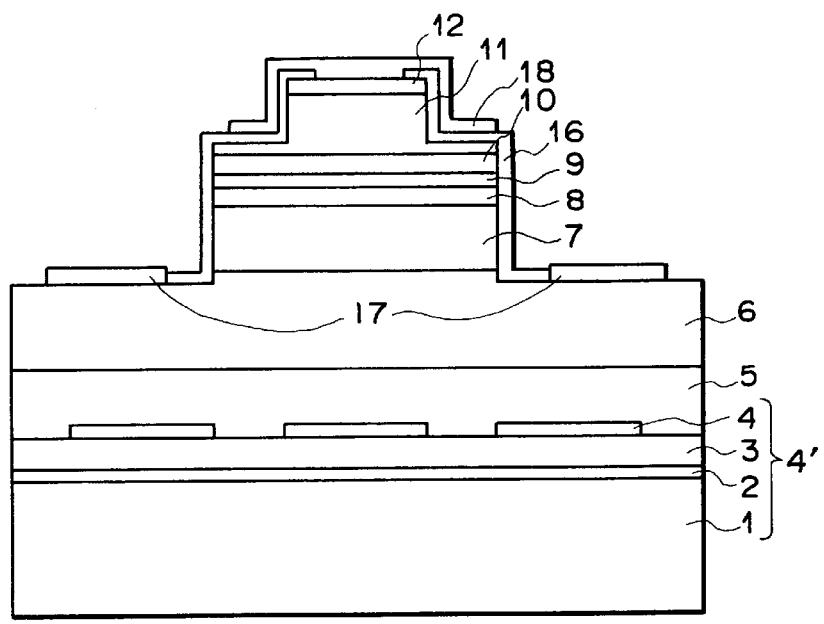
FIG. 3 is a cross-sectional view of a complete construction of the short-wavelength semiconductor laser device as the first embodiment of the present invention.

FIGS. 1 to 3 are cross-sectional views of a short-wavelength semiconductor laser device as the first embodiment of the present invention, where FIGS. 1 and 2 are cross-sectional views at first and second intermediate production stages, respectively, and FIG. 3 is a cross-sectional view of a complete construction of the short-wavelength semiconductor laser device as the first embodiment of the present invention.

As illustrated in FIG. 1, a GaN buffer layer 2 having a thickness of about 20 nm is formed at a temperature of 500° C. on a (0001) C face of a sapphire substrate 1 by using organometallic vapor phase epitaxy. Then, a GaN layer 3 having a thickness of about 2 micrometers is formed at a temperature of 1,050° C. on the GaN buffer layer 2. Materials used in the growth of the layers are trimethyl gallium (TMG), trimethyl indium (TMI), trimethyl aluminum (TMA) and ammonia. In addition, silane gas is used as an n-type dopant gas, and cycropentadienyl magnesium (CP2Mg) is used as a p-type dopant gas.

On the above GaN layer 3, an SiO2 layer 4 having a thickness of 3 micrometers is formed. Next, the SiO2 layer 4 in stripe areas, which are spaced out and oriented in the [1$\bar{1}$00] direction, are removed by using conventional lithography so that remaining stripe areas spaced at intervals of about 10 micrometers form a line-and-space pattern. Thus, a base 4' for selective growth is formed. Then, an $In_{x1}Ga_{1-x1}N$ layer 5 having a thickness of about 20 micrometers is formed at a temperature of 750° C. by selective growth. In the operation of forming the $In_{x1}Ga_{1-x1}N$ layer 5, finally, the surface of the $In_{x1}Ga_{1-x1}N$ layer 5 is planarized by growth in the lateral directions. Further, a silicon-doped $In_{x1}Ga_{1-x1}N$ layer 6 of a thickness of about 5 micrometers is formed at the same temperature.

Subsequently, a Si-doped $In_{x2}(Al_{z2}Ga_{1-z2})_{1-x2}N$ (2.5 nm)/$In_{x3}(Al_{z3}Ga_{1-z3})_{1-x3}N$ (2.5 nm) superlattice cladding layer 7 having 240 layers, a silicon-doped $In_{x3}(Al_{z3}Ga_{1-z3})_{1-x3}N$ optical waveguide layer 8, an $In_{x3}Ga_{1-x3}N/In_{x4}Ga_{1-x4}N$ (2.5 nm) multiple quantum well active layer 9, a magnesium-doped $In_{x3}(Al_{z3}Ga_{1-z3})_{1-x3}N$ (2.5 nm) optical waveguide layer 10, a Mg-doped $In_{x2}(Al_{z2}Ga_{1-z2})_{1-x2}N/In_{z3}(Al_{z3}Ga_{1-z3})_{1-x3}N$ (2.5 nm) superlattice cladding layer 11, and a magnesium-doped $In_{x1}Ga_{1-x1}N$ contact layer 12 are formed in this order. In order to activate the p-type magnesium impurity, heat treatment may be performed in a nitrogen atmosphere after the above growth. Alternatively, the growing operation may be performed in a nitrogen-rich atmosphere. The compositions in the above layers are determined within the ranges of: $0.05 < x1 \leq 0.1$, $0 < x2 < x1 < x3 < x4 \leq 0.4$, $0 \leq z2 \leq 1$, and $0 \leq z3 \leq 1$.

In addition, a $SiO_2$ layer 13 is formed on the above contact layer 12. Thereafter, the $SiO_2$ layer 13, except for a stripe area thereof having a width of 4 micrometers, is removed by conventional lithography, and then selective etching is performed by using a reactive ion etching (RIE) apparatus until a part of the thickness of the superlattice cladding layer 11 is etched. Thus, ridges 14 are formed as illustrated in FIG. 2. The remaining thickness of the superlattice cladding layer 11 is such that the basic transverse mode oscillation is realized. Then, the remaining portion of the $SiO_2$ layer 13 is removed. Thereafter, a $SiO_2$ film 15 is formed, then the $SiO_2$ film 15, except for a stripe area thereof having a width of 5 micrometers, is removed by conventional lithography. Next, etching is performed by using reactive ion etching (RIE) until the Si-doped $In_{x1}Ga_{1-x1}N$ layer 6 is exposed, and then the $SiO_2$ film 15 is removed. Further, an insulation layer 16, an n electrode 17 made of Ti/Au, and a p electrode 18 made of Ni/Au are formed by conventional lithography as illustrated in FIG. 3, where the p electrode 18 is formed on the surface of the p contact layer 12, and has a stripe shape. Thereafter, end surfaces of the resonant cavity are formed by polishing the substrate and cleaving the layered materials, and high-reflection coating and low-reflection coating are laid on the end surfaces of the resonant cavity, respectively. Then, the construction of FIG. 3 is formed into a chip.

The wavelength band of oscillation in the short-wavelength semiconductor laser device formed as described above can be controlled in the range of $400<\lambda<550$ (nm) by varying the indium content in the $In_{x4}Ga_{1-x4}N$ active layers.

Although impurity is doped only in the barrier layer in the supperlattice cladding layer in the above-described embodiment, it may be doped into both the well layer and the barrier layer of the superlattice structure.

It is possible to change the types of conductivity (i.e., alternate the n-types and the p-types) in the above construction of the first embodiment.

Second Embodiment

Figure 4:
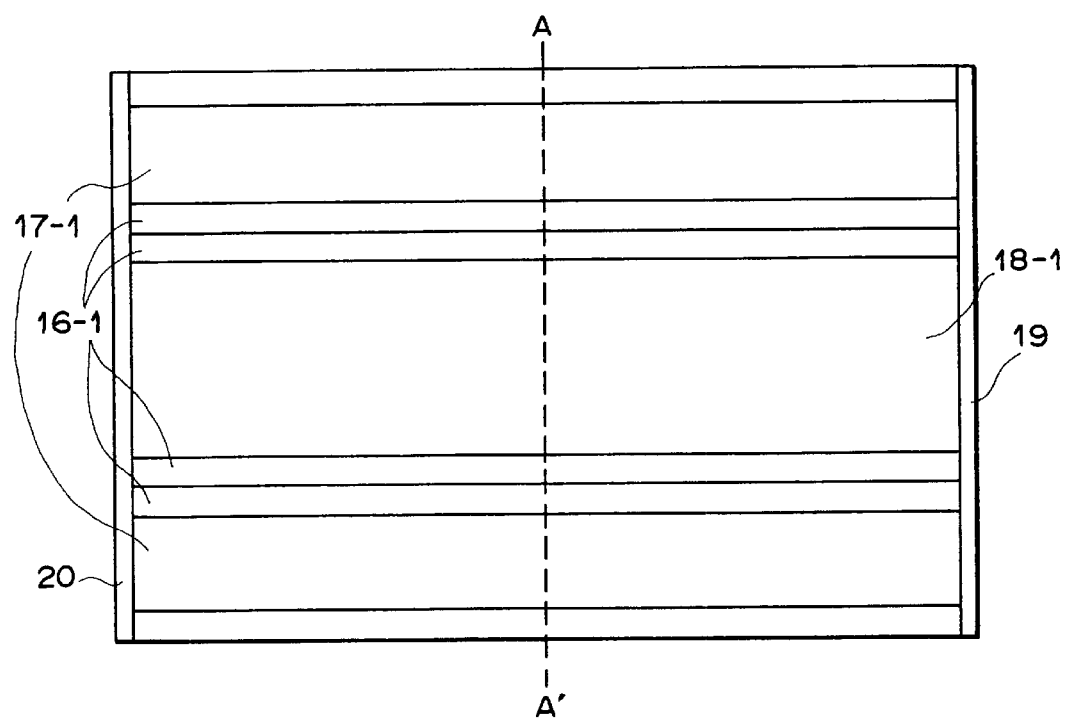
FIG. 4 is a plan view of the short-wavelength semiconductor laser device as the second embodiment of the present invention.
Figure 5:
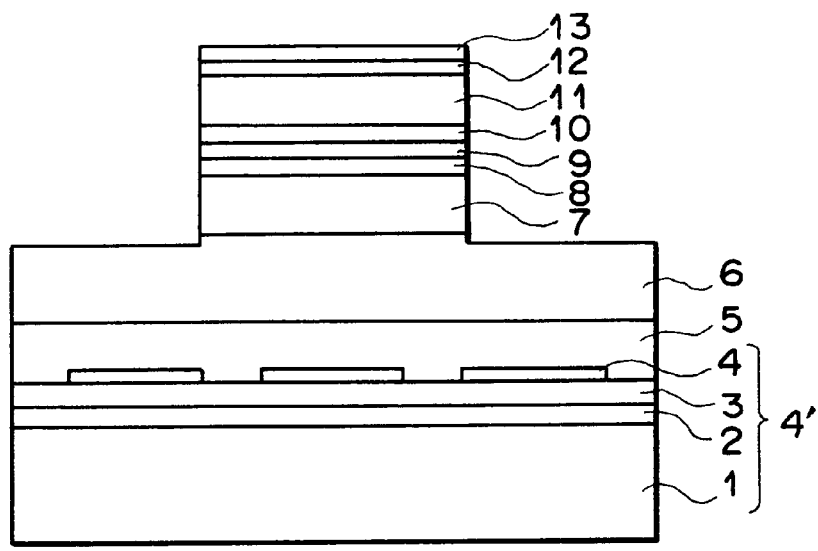
FIG. 5 is a cross-sectional view of the short-wavelength semiconductor laser device as the second embodiment of the present invention at an intermediate production stage.
Figure 6:
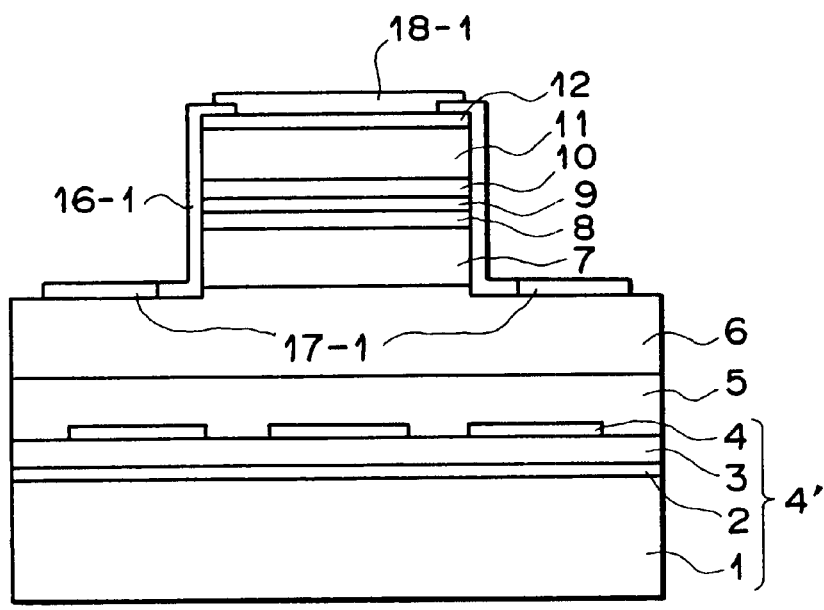
FIG. 6 is a cross-sectional view of a complete construction of the short-wavelength semiconductor laser device as the second embodiment of the present invention.

Next, the second embodiment of the present invention will be explained. FIG. 4 is a plan view of a short-wavelength semiconductor laser device as the second embodiment of the present invention, FIG. 5 is a cross-sectional view of an intermediate construction during the formation of the short-wavelength semiconductor laser device of FIG. 4, and FIG. 6 is a cross-sectional view of a completed construction of the short-wavelength semiconductor laser device of FIG. 4.

In the second embodiment, first, the same layers as the layers 1 to 13 in the construction of FIG. 1 are formed in the same manner as explained for the first embodiment. Then, the $SiO_2$ film 13, except for a stripe area thereof having a width of 20 to 200 micrometers, is removed by conventional lithography. Next, etching is performed by using reactive ion etching (RIE) until the Si-doped $In_{x1}Ga_{1-x1}N$ layer 6 is exposed as illustrated in FIG. 5, and then the remaining $SiO_2$ film 13 is removed. Further, an insulation layer 16-1, an n electrode 17-1 made of Ti/Au, and a p electrode 18-1 made of Ni/Au are formed by conventional lithography as illustrated in FIG. 6, where the p electrode 18-1 is formed on the surface of the p contact layer 12, and has a stripe shape. Thereafter, end surfaces of the resonant cavity are formed by polishing the substrate and cleaving the layered materials, and high-reflection coating 19 and low-reflection coating 20 are laid on the end surfaces of the resonant cavity, respectively. Then, the construction of FIG. 6 is formed into a chip. Thus, a high-power short-wavelength semiconductor laser device of the second embodiment is realized. The wavelength band of oscillation in the short-wavelength semiconductor laser device formed as described above can also be controlled in the range of $400<\lambda<550$ (nm) by varying the indium content in the $In_{x4}Ga_{1-x4}N$ active layers.

It is also possible to change types of conductivity (i.e., alternate the n-types and the p-types) in the above construction of the second embodiment.

Third Embodiment

The third embodiment of the present invention will be explained below.

Figure 7:
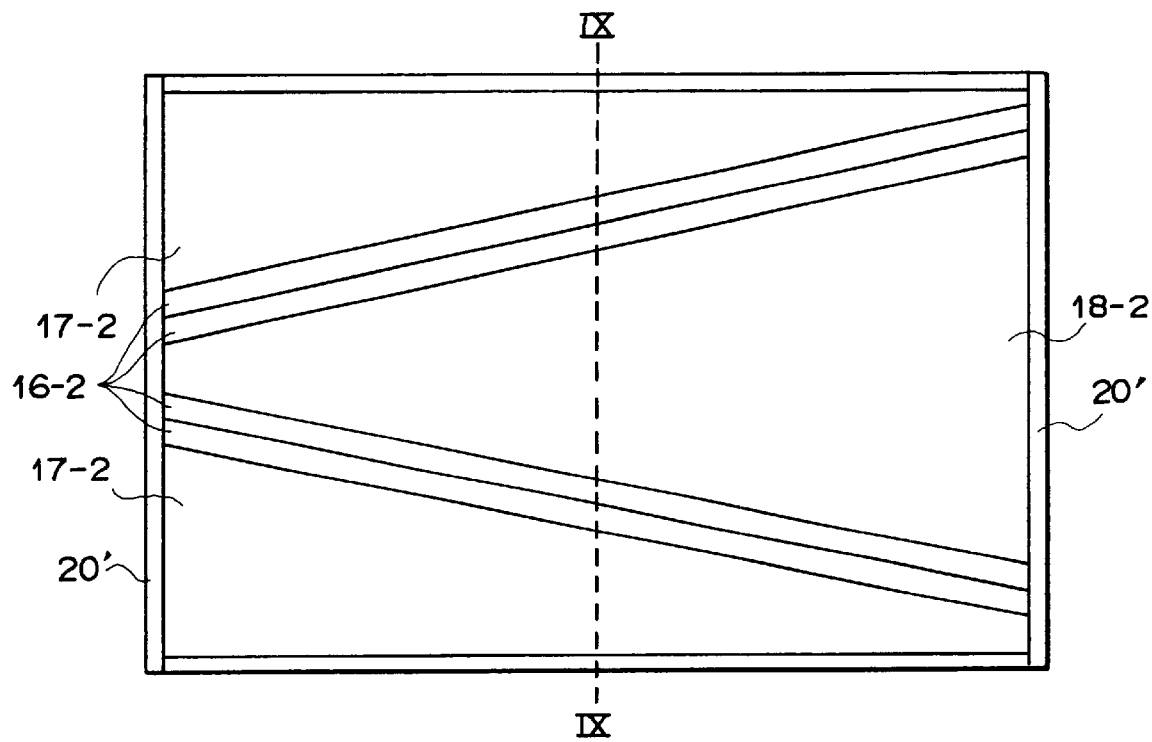
FIG. 7 is a plan view of the short-wavelength optical amplifying device as the third embodiment of the present invention.
Figure 8:
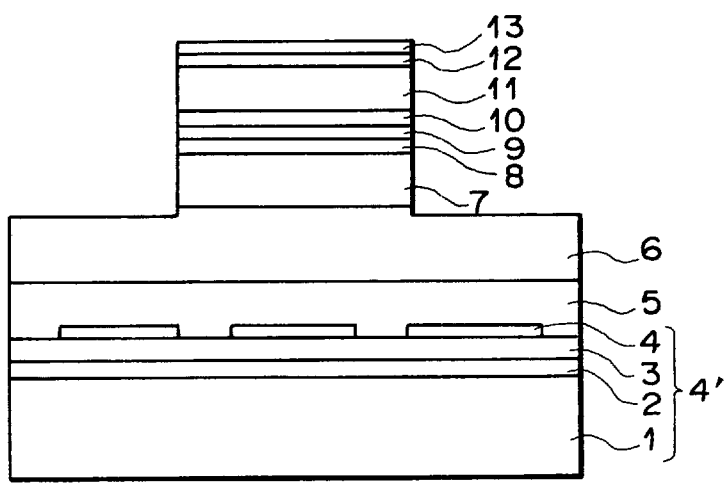
FIG. 8 is a cross-sectional view of the short-wavelength optical amplifying device as the third embodiment of the present invention at a first intermediate production stage.
Figure 9:
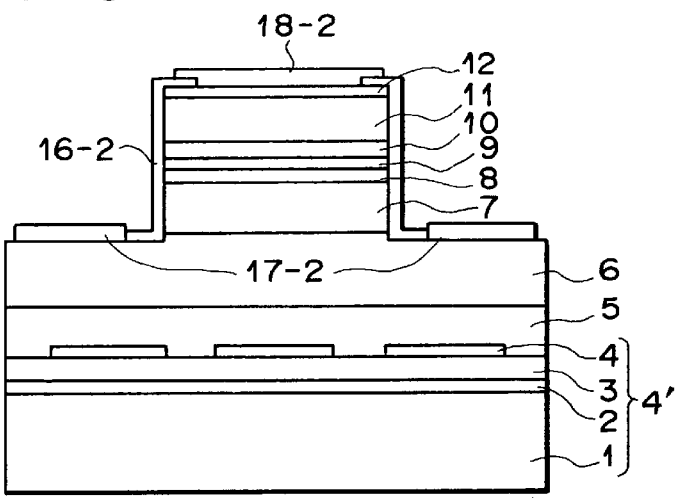
FIG. 9 is a IX—IX cross-sectional view of a complete construction of the short-wavelength optical amplifying device as the third embodiment of the present invention.

FIG. 7 is a plan view of a short-wavelength optical amplifying device as the third embodiment of the present invention, FIG. 8 is a cross-sectional view of the intermediate construction during the formation of the short-wavelength optical amplifying device of FIG. 7, and FIG. 9 is a cross-sectional view of a complete construction of the short-wavelength optical amplifying device of FIG. 7 taken along the line IX—IX.

In the third embodiment, first, the same layers as the layers 1 to 13 in the construction of FIG. 1 are formed in the same manner as explained for the first embodiment. Then, the $SiO_2$ film 13, except for an area thereof having a tapered-shape as illustrated in FIG. 7, is removed by conventional lithography, where the tapered-shape widens from the input port size of 3 micrometers with a total tapered angle of about 8 degrees. Next, etching is performed using reactive ion etching (RIE) until the Si-doped $In_{x1}Ga_{1-x1}N$ layer 6 is exposed as illustrated in FIG. 8, and then the remaining $SiO_2$ film 13 is removed. Further, an insulation layer 16-2, an n electrode 17-2 made of Ti/Au, and a p electrode 18-2 made of Ni/Au are formed by conventional lithography, as illustrated in FIG. 9, where the p electrode 18-2 is formed on the surface of the p contact layer 12, and has a stripe shape. Thereafter, end surfaces of a resonant cavity are formed by polishing the substrate and cleaving the layered materials, and nonreflection coating 20' is laid on the end surfaces of the resonant cavity. Then, the construction of FIG. 9 is formed into a chip. Thus, the high-power short-wavelength optical amplifying device as the third embodiment is realized. The amplifiable wavelength band of the optical amplifying device formed as described above can also be controlled in the range of $400<\lambda<550$ (nm) by varying the indium content in the $In_{x4}Ga_{1-x4}N$ active layers.

It is also possible to change types of conductivity (i.e., alternate the n-types and the p-types) in the above construction of the third embodiment.

Fourth Embodiment

The fourth embodiment of the present invention will be explained below.

Figure 10:
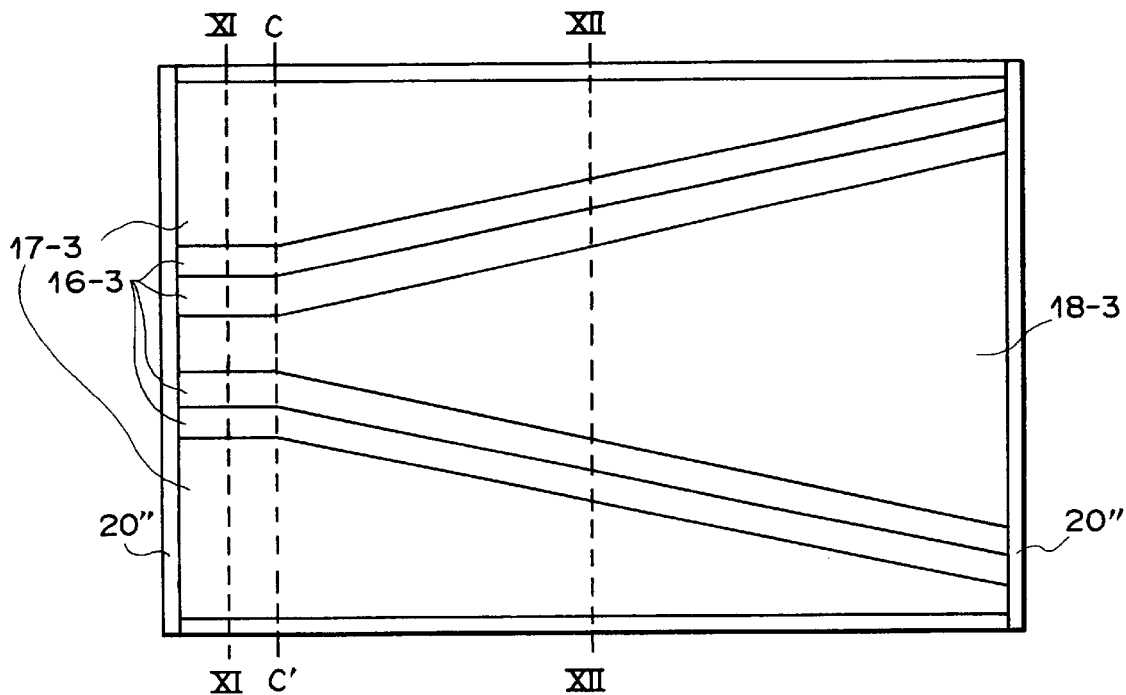
FIG. 10 is a plan view of an optical amplifying device as the fourth embodiment of the present invention.

FIG. 10 is a plan view of an optical amplifying device as the fourth embodiment of the present invention, FIG. 11 is a cross-sectional view of the optical amplifying device as the fourth embodiment of the present invention at the XI—XI cross-section indicated in FIG. 10, and FIG. 12 is a cross-sectional view of the optical amplifying device as the fourth embodiment of the present invention at the XII—XII cross-section indicated in FIG. 10. The optical amplifying device as the fourth embodiment of the present invention has ridges on a light-incident side thereof, where the ridges are provided for realizing an index-guided waveguide in the optical amplifying device.

In the fourth embodiment, the layers 1 to 13 are formed in the same manner as the third embodiment, and an insulation layer 16-3, an n electrode 17-3 made of Ti/Au, and a p electrode 18-3 made of Ni/Au are also formed in the same manner as the insulation layer 16-2, the n electrode 17-2, and the p electrode 18-2 in the third embodiment, respectively. However, in the fourth embodiment, as illustrated in FIG. 11, ridges are formed by photolithography on only the left side (light-incident side) of the cross-section C–C' indicated in FIG. 10. The amplifiable wavelength band of the optical amplifying device formed as described above can also be controlled in the range of 400<λ<550 (nm) by varying the indium content in the $In_{x4}Ga_{1-x4}N$ active layers.

Figure 13:
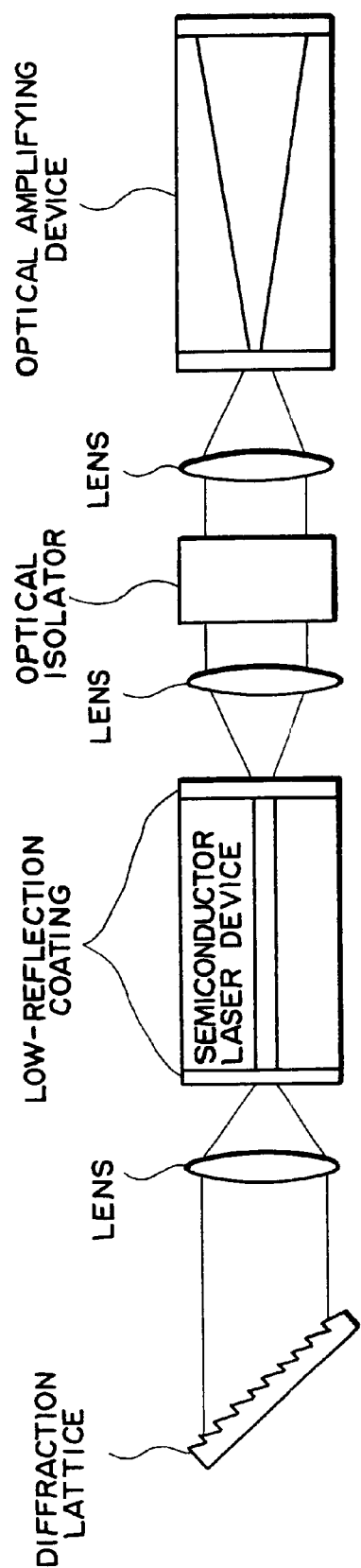
FIG. 13 is a diagram illustrating an exemplary construction using the optical amplifying device, where the optical amplifying device is connected with a master light source realized by a single-mode semiconductor laser device which has a feedback function using a diffraction grating.
Figure 14:
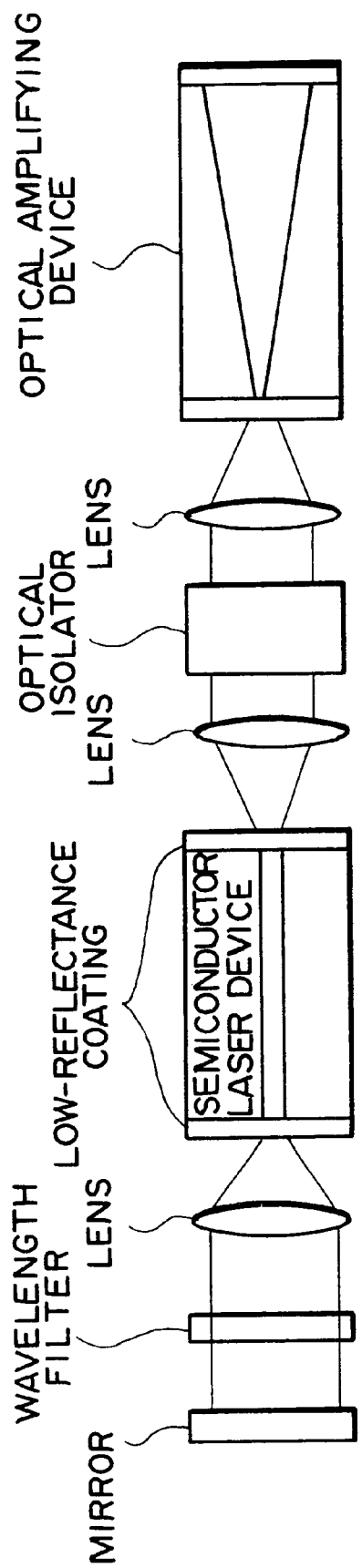
FIG. 14 is a diagram illustrating an exemplary construction using the optical amplifying device, where the optical amplifying device is connected with a master light source realized by a single-mode semiconductor laser device which is controlled by using a wavelength filter.
Figure 15:
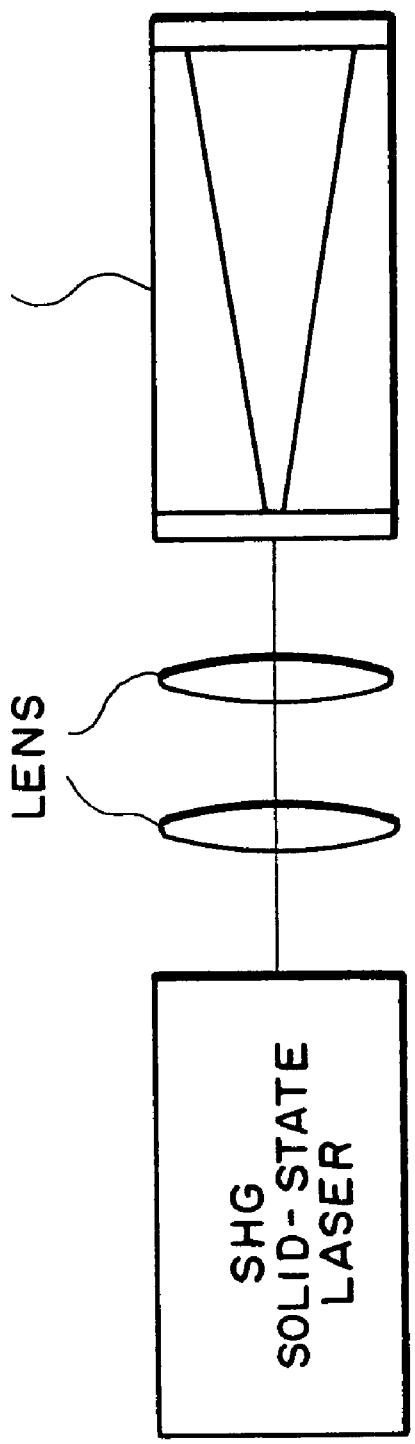
FIG. 15 is a diagram illustrating an exemplary construction using the optical amplifying device, where the optical amplifying device is connected with a master light source realized by a solid-state laser device which uses a second harmonic generating element using semiconductor laser excitation of infrared light.

Each of the optical amplifying devices in the third and fourth embodiments is used with a master light source connected to the input port of the optical amplifying device. Three examples of the master light source are illustrated in FIGS. 13 to 15. The master light source illustrated in FIG. 13 is a single-mode semiconductor laser device which has a feedback function using a diffraction grating. The master light source illustrated in FIG. 14 is a single-mode semiconductor laser device which is controlled by using a wavelength filter. The master light source illustrated in FIG. 15 is a solid-state laser device which uses a second harmonic generating element using semiconductor laser excitation of infrared light.

Fifth Embodiment

The fifth embodiment of the present invention will be explained below.

Figure 16:
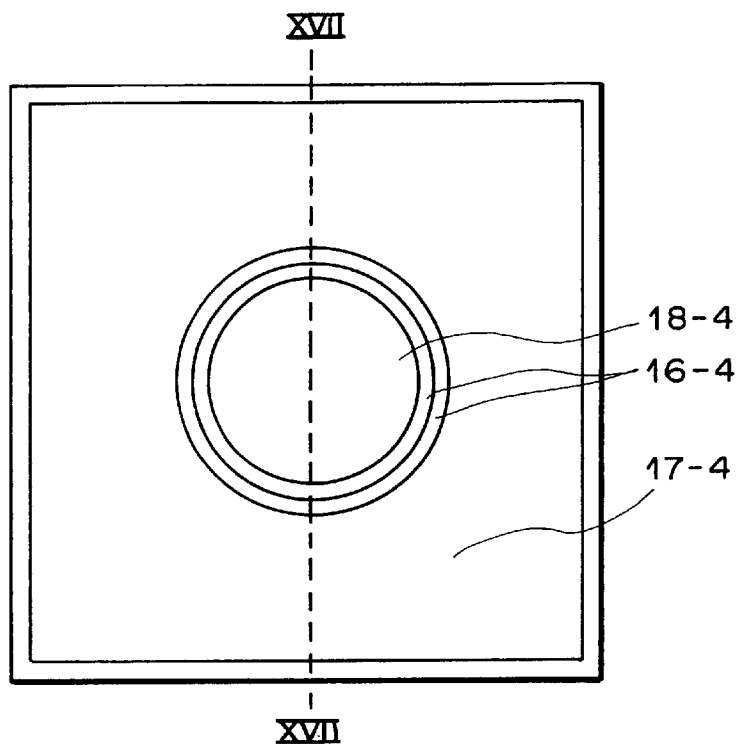
FIG. 16 is a plan view of the short-wavelength light emitting device as the fifth embodiment of the present invention.
Figure 17:
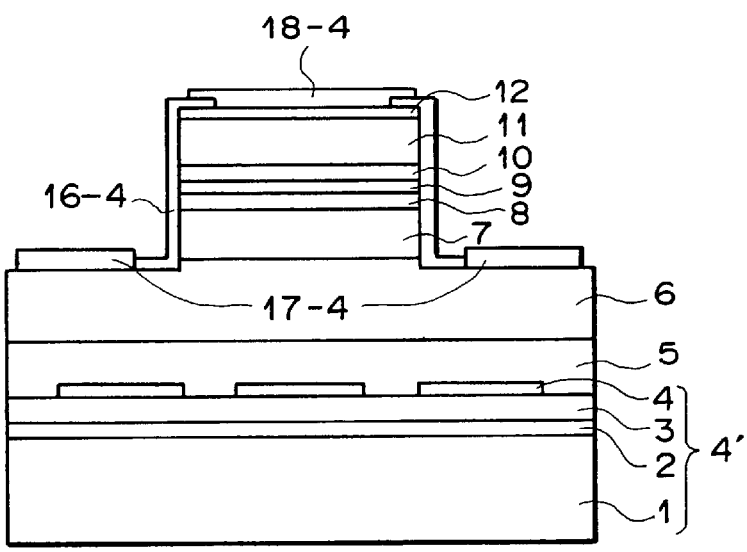
FIG. 17 is a cross-sectional view of the short-wavelength light emitting device as the fifth embodiment of the present invention taken along line XVII—XVII in FIG. 16.

FIG. 16 is a plan view of a short-wavelength light emitting device as the fifth embodiment of the present invention, and FIG. 17 is a cross-sectional view of the short-wavelength light emitting device at the XVII—XVII cross-section indicated in FIG. 16.

In the fifth embodiment, the layers 1 to 13 are formed in the same manner as the second embodiment. Then, the $SiO_2$ film 13, except for an area thereof having a round shape, is removed by conventional lithography. Next, etching is performed using reactive ion etching (RIE) until the Si-doped $In_{x1}Ga_{1-x1}N$ layer 6 is exposed, and then the remaining $SiO_2$ film 13 is removed. Further, an insulation layer 16-4, an n electrode 17-4 made of Ti/Au, and a p electrode 18-4 made of Ni/Au are formed by conventional lithography, as illustrated in FIGS. 16 and 17, where the p electrode 18-4 is formed on the surface of the p contact layer 12. Thereafter, the substrate is polished and the layered materials are cleaved. Then, the construction illustrated in FIGS. 16 and 17 is formed into a chip. Thus, the high-power short-wavelength light emitting device of the fifth embodiment is realized. The wavelength of emitted light in the short-wavelength light emitting device formed as described above can also be controlled in the range of 400<λ<550 (nm) by varying the indium content in the $In_{x4}Ga_{1-x4}N$ active layers.

It is also possible to change types of conductivity (i.e., the n-types and the p-types with each other) in the above construction of the fifth embodiment.

Sixth Embodiment

The sixth embodiment of the present invention will be explained below.

Figure 18:
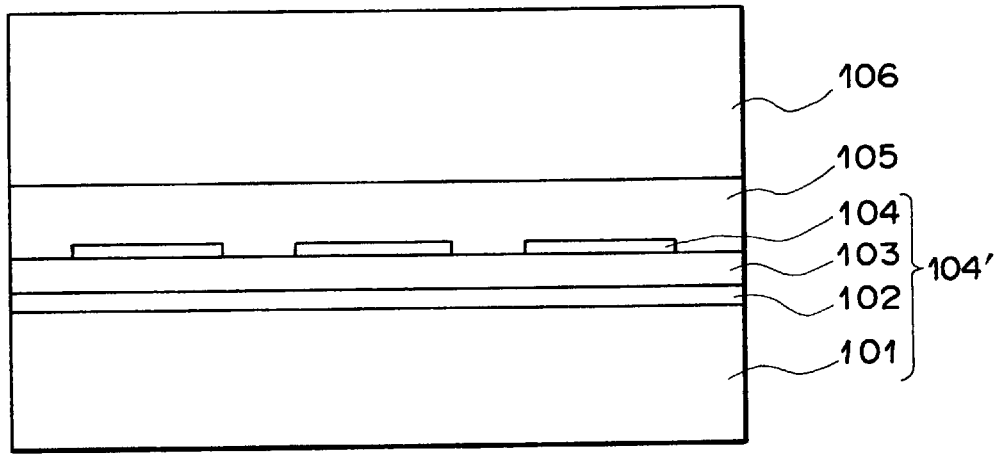
FIG. 18 is a cross-sectional view of the semiconductor laser device as the sixth embodiment of the present invention at a first intermediate production stage.
Figure 19:
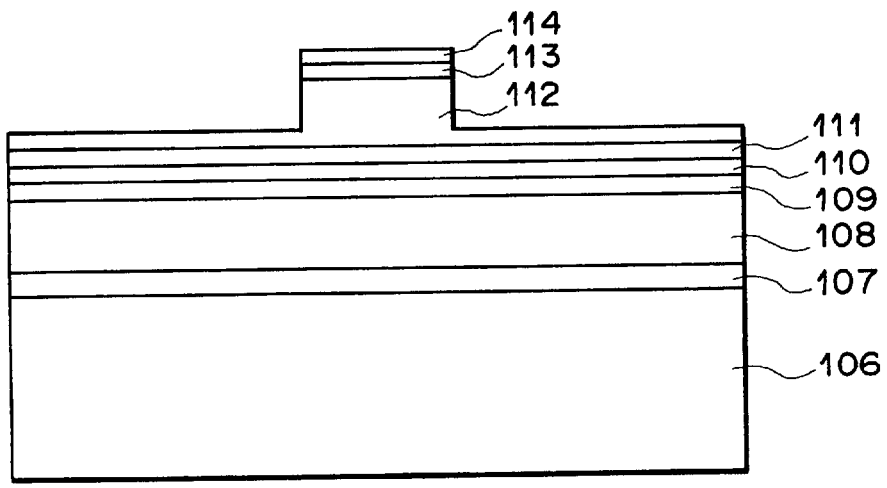
FIG. 19 is a cross-sectional view of the semiconductor laser device as the sixth embodiment of the present invention at a second intermediate stage at a second intermediate production stage.

FIG. 18 is a cross-sectional view of the semiconductor laser device as the sixth embodiment of the present invention at a first intermediate production stage. FIG. 19 is a cross-sectional view of the semiconductor laser device as the sixth embodiment of the present invention at a second intermediate production stage. FIG. 20 is a cross-sectional view of a complete construction of the semiconductor laser device as the sixth embodiment of the present invention.

As illustrated in FIG. 18, a GaN buffer layer 102 having a thickness of about 20 nm is formed at a temperature of 500° C. on a (0001) C face of a sapphire substrate 101 by using the organometallic vapor phase epitaxy technique. Then, a GaN layer 103 having a thickness of about 2 micrometers is formed at a temperature of 1,050° C. on the GaN buffer layer 102. Materials used in the growth of the layers are trimethyl gallium (TMG), trimethyl indium (TMI), trimethyl aluminum (TMA)and ammonia. In addition, silane gas is used as an n-type dopant gas, and cycropentadienyl magnesium (CP2Mg) is used as a p-type dopant gas.

On the above GaN layer 103, a SiO2 layer 104 having a thickness of 3 micrometers is formed. Next, the SiO2 layer 104 in stripe areas, which are spaced out and oriented in the [1$\bar{1}$00] direction, is removed by using conventional lithography, so that remaining stripe areas spaced at intervals of about 10 micrometers form a line-and-space pattern. Thus, a base 104' for selective growth is formed. Then, an $In_{x1}Ga_{1-x1}N$ layer 105 (0.05<x1≦0.1) of a thickness of about 20 micrometers is formed at a temperature of 750° C. by selective growth. In the operation of forming the $In_{x1}Ga_{1-x1}N$ layer 105, finally, the surface of the $In_{x1}Ga_{1-x1}N$ layer 105 is planarized by growth in the lateral directions. Further, a silicon-doped $In_{x1}Ga_{1-x1}N$ layer 106 of a thickness of about 100 to 200 micrometers is formed. Then, the sapphire substrate 101, the GaN buffer layer 102, the GaN layer 103, the SiO2 layer 104, and the $In_{x1}Ga_{1-x1}N$ layer 105 are removed by polishing to use the Si-doped $In_{x1}Ga_{1-x1}N$ layer 106 as a substrate.

Subsequently, a silicon-doped $In_{x1}Ga_{1-x1}N$ layer 107, an Si-doped $In_{x1}(Al_{z2}Ga_{1-z2}N$ (2.5 nm)/$In_{x3}(Al_{z3}Ga_{1-x3}N$ (2.5 nm) superlattice cladding layer 108 having 240 layers, a silicon-doped $In_{x3}(Al_{z3}Ga_{1-z3})_{1-x3}N$ optical waveguide layer 109, an $In_{x3}Ga_{1-x3}N$ (5 nm)/$In_{x4}Ga_{1-x4}N$ (2.5 nm) multiple quantum well active layer 110, a magnesium-doped $In_{x3}(Al_{z3}Ga_{1-z3})_{1-x3}N$ optical waveguide layer 111, a Mg-doped $In_{x2}(Al_{z2}Ga_{1-x2})_{1-x2}N$ (2.5 nm)/$In_{x3}(Al_{z3}Ga_{1-z3})_{1-x3}N$ (2.5 nm) superlattice cladding layer 112, and a magnesium-doped $In_{x1}Ga_{1-x1}N$ contact layer 113 are formed in this order. In order to activate the p-type magnesium impurity, heat treatment may be performed in a nitrogen atmosphere after the above growth. Alternatively, the growing operation may be performed in a nitrogen-rich atmosphere. The compositions in the above layers are determined within the ranges of: 0.05<x1≦0.1, 0<x2<x1<x3<x4≦0.4, 0≦z2≦1, and 0≦z3≦1.

In addition, a $SiO_2$ layer 114 is formed on the above contact layer 12. Thereafter, the $SiO_2$ layer 114, except for a stripe area thereof having a width of 4 micrometers, is removed by conventional lithography, and then selective etching is performed using a reactive ion etching (RIE) apparatus until a part of the thickness of the superlattice cladding layer 112 is etched. The remaining thickness of the superlattice cladding layer 112 is such that basic transverse mode oscillation is realized. Next, the remaining portion of the $SiO_2$ layer 114 is removed. Thereafter, an $SiO_2$ film 115 is formed, then the $SiO_2$ film 115 in the top area is removed by conventional lithography. A p electrode 116 having a shape of a stripe and being made of Ni/Au is then formed on the surface of the p contact layer 113. Thereafter, the rearside of the Si-doped $In_{x1}Ga_{1-x1}N$ layer 106 is polished, and an n electrode 117 made of Ti/Au is formed on the polished surface as illustrated in FIG. 20. Then, end surfaces of the resonant cavity are formed by polishing the substrate and cleaving the layered materials, and high-reflection coating and low-reflection coating are laid on the end surfaces of the resonant cavity, respectively. The construction of FIG. 20 is then formed into a chip to realize the semiconductor laser device as the sixth embodiment of the present invention.

The wavelength band of oscillation in the semiconductor laser device formed as described above can be controlled in the range of 400<λ<550 (nm) by varying the indium content in the $In_{x4}Ga_{1-x4}N$ active layers.

Although impurity is doped only in the barrier layer in the supperlattice cladding layer in the above-described embodiment, it may be doped into both the well layer and the barrier layer of the superlattice structure.

It is also possible to change types of conductivity (i.e., the n-types and the p-types with each other) in the above construction of the sixth embodiment.

In addition, the above Si-doped $In_{x1}Ga_{1-x1}N$ layer 106 may be formed by using the hydride vapor phase epitaxy.

Others

Further, the n electrodes 17-1 and 17-2 in the semiconductor devices of the second and third embodiments may also be formed on the rearside of the Si-doped $In_{x1}Ga_{1-x1}N$ layer 6 in the same manner as the sixth embodiment.

The substrates in the first to sixth embodiments may be made of SiC, ZnO, $LiGaO_2$, $LiAlO_2$, ZnSe, GaAs, GaP, Ge, and Si, instead of sapphire.

When GaAs, GaP, Ge, or Si substrate is used in the sixth embodiment, this substrate may be removed by selective chemical etching.

In addition, all of the contents of Japanese Patent Application, No.11(1999)-30050 are incorporated into this specification by reference.

What is claimed is:

1. A semiconductor laser device comprising:
   a pair of electrodes;
   a conductive substrate connected to one of the pair of electrodes;
   a lower cladding layer formed on the conductive substrate;
   a lower optical waveguide layer formed on the lower cladding layer;
   a single or multiple quantum well active layer formed on the lower optical waveguide layer;
   an upper optical waveguide layer formed on the quantum well active layer;
   an upper cladding layer formed on the upper optical waveguide layer; and
   a contact layer formed on the upper cladding layer;
   the other of the pair of electrodes formed on the contact layer; wherein
   the conductive substrate is made of InGa material, and the lower cladding layer is made of one of InGaN and InGaAlN material and has a composition which causes a strain not less than −0.01 and not greater than 0.01 between the lower cladding layer and the conductive substrate.

2. A semiconductor laser device according to claim 1, wherein the cladding layers may have a superlattice structure and a composition such that a strain in the cladding layer is not less than −0.01 and not greater than 0.01.

3. A semiconductor laser device according to claim 1, wherein the cladding layers have a modulation-doped superlattice structure in which impurity is doped into barrier layers in the superlattice structure, and the cladding layers have a composition such that a strain in the cladding layer is not less than −0.01 and not greater than 0.01.

4. A semiconductor laser device according to claim 1, wherein the cladding layers have a superlattice structure in which impurity is doped into both of the well layers and the barrier layers in the superlattice structure, and the cladding layers have a composition such that a strain in the cladding layer is not less than −0.01 and not greater than 0.01.

5. A semiconductor laser device according to claim 1 wherein the contact layer is made of InGaN material.

6. A semiconductor laser device according to claim 1 wherein the conductive substrate is formed on a first substrate formed on a second substrate by selective growth, where the first substrate is made of InGa material.

7. A semiconductor laser device according to claim 6 wherein the second substrate is a material selected from the group consisting of: sapphire, SiC, $LiGaO_2$, $LiAlO_2$, ZnSe, GaAs, GaP, Ge, and Si.

8. A semiconductor laser device according to claim 2 wherein the contact layer is made of InGaN material.

9. A semiconductor laser device according to claim 3 wherein the contact layer is made of InGaN material.

10. A semiconductor laser device according to claim 4 wherein the contact layer is made of InGaN material.

11. A semiconductor laser device according to claim 2 wherein the conductive substrate is formed on a first substrate formed on a second substrate by selective growth, where the first substrate is made of InGa material.

12. A semiconductor laser device according to claim 3 wherein the conductive substrate is formed on a first substrate formed on a second substrate by selective growth, where the first substrate is made of InGa material.

13. A semiconductor laser device according to claim 4 wherein the conductive substrate is formed on a first substrate formed on a second substrate by selective growth, where the first substrate is made of InGa material.

14. A semiconductor laser device according to claim 10 wherein the second substrate is a material selected from the group consisting of: sapphire, SiC, $LiGaO_2$, $LiAlO_2$, ZnSe, GaAs, GaP, Ge, and Si.

15. A semiconductor laser device according to claim 11 wherein the second substrate is a material selected from the group consisting of: sapphire, SiC, $LiGaO_2$, $LiAlO_2$, ZnSe, GaAs, GaP, Ge, and Si.

16. A semiconductor laser device according to claim 12 wherein the second substrate is a material selected from the group consisting of: sapphire, SiC, $LiGaO_2$, $LiAlO_2$, ZnSe, GaAs, GaP, Ge, and Si.

17. A semiconductor laser device comprising:
    a pair of electrodes;
    a conductive substrate connected to one of the pair of electrodes, wherein the conductive substrate is formed on a first substrate formed on a second substrate by selective growth;
    a lower cladding layer formed on the conductive substrate;
    a lower optical waveguide layer formed on the lower cladding layer;
    a single or multiple quantum well active layer formed on the lower optical waveguide layer;
    an upper optical waveguide layer formed on the quantum well active layer;
    an upper cladding layer formed on the upper optical waveguide layer; and
    a contact layer formed on the upper cladding layer;
    the other of the pair of electrodes formed on the contact layer; wherein
    the conductive substrate is made of InGa material, and the lower cladding layer is made of one of InGaN and InGaAlN material and has a composition which causes a strain not less than −0.01 and not greater than 0.01 between the lower cladding layer and the conductive substrate.

18. A semiconductor laser device comprising:

a pair of electrodes;

a conductive substrate connected to one of the pair of electrodes, wherein the conductive substrate includes In material;

a lower cladding layer formed on the conductive substrate, wherein the lower cladding layer includes In material;

a lower optical waveguide layer formed on the lower cladding layer, wherein the lower optical waveguide layer includes In material;

a single or multiple quantum well active layer formed on the lower optical waveguide layer, wherein the quantum well active layer includes In material;

an upper optical waveguide layer formed on the quantum well active layer, wherein the upper optical waveguide layer includes In material;

an upper cladding layer formed on the upper optical waveguide layer, wherein the upper cladding layer includes In material; and a contact layer formed on the upper cladding layer;

the other of the pair of electrodes formed on the contact layer; wherein the conductive substrate is made of InGa material, and the lower cladding layer is made of one of InGaN and InGaAlN material and has a composition which causes a strain not less than −0.01 and not greater than 0.01 between the lower cladding layer and the conductive substrate.

19. A semiconductor laser device according to claim 18, wherein the conductive substrate is formed on a first substrate formed on a second substrate by selective growth, where the first substrate is made of InGa material.

* * * * *